(12) United States Patent
Gill et al.

(10) Patent No.: US 8,284,525 B2
(45) Date of Patent: Oct. 9, 2012

(54) CURRENT PERPENDICULAR TO PLANE MAGNETORESISTANCE READ HEAD DESIGN USING A CURRENT CONFINEMENT STRUCTURE PROXIMAL TO AN AIR BEARING SURFACE

(75) Inventors: Hardayal S. Gill, Palo Alto, CA (US); Werner J. Douglas, Fremont, CA (US); Wipul P. Jayasekara, Los Gatos, CA (US); Wen-Chien Hsiao, San Jose, CA (US)

(73) Assignee: HGST Netherlands, B.V., Amsterdam (NL)

( * ) Notice: Subject to any disclaimer, the term of this patent is extended or adjusted under 35 U.S.C. 154(b) by 0 days.

(21) Appl. No.: 13/314,449

(22) Filed: Dec. 8, 2011

(65) Prior Publication Data
US 2012/0075751 A1    Mar. 29, 2012

Related U.S. Application Data

(63) Continuation of application No. 12/182,701, filed on Jul. 30, 2008, now Pat. No. 8,098,463.

(51) Int. Cl.
*G11B 5/31* (2006.01)
(52) U.S. Cl. ....................................... 360/319
(58) Field of Classification Search .................. None
See application file for complete search history.

(56) References Cited

U.S. PATENT DOCUMENTS

| 5,818,684 | A  | * | 10/1998 | Iwasaki et al. | 360/319 |
|---|---|---|---|---|---|
| 6,031,691 | A  | * | 2/2000 | Onuma et al. | 360/320 |
| 6,504,687 | B1 | * | 1/2003 | Miyatake et al. | 360/319 |
| 6,693,774 | B2 | * | 2/2004 | Watanabe et al. | 360/319 |
| 6,751,071 | B2 | * | 6/2004 | Yazawa et al. | 360/319 |
| 6,842,313 | B1 | * | 1/2005 | Mallary | 360/319 |
| 7,212,382 | B2 | * | 5/2007 | Otomo | 360/317 |
| 7,408,746 | B2 | * | 8/2008 | Sato | 360/322 |
| 7,656,620 | B2 | * | 2/2010 | Nishiyama et al. | 360/319 |
| 7,826,179 | B2 | * | 11/2010 | Shimazawa et al. | 360/319 |

* cited by examiner

*Primary Examiner* — Mark Blouin
(74) *Attorney, Agent, or Firm* — Duft Bornsen & Fishman, LLP

(57) ABSTRACT

A current to perpendicular to plane (CPP) magnetoresistance (MR) read head using current confinement proximal to an air bearing surface (ABS) is disclosed. A CPP MR read head includes a first shield, an MR sensor formed on the first shield, and a second shield contacting the MR sensor proximal to an ABS. The CPP MR read head further includes insulating material between the MR sensor and the second shield, where the insulating material is distal to the ABS to electrically isolate the MR sensor from the second shield distal to the ABS. Sense current injected from the second shield through the MR sensor and into the first shield is confined proximal to the ABS at a location where the second shield contacts the MR sensor.

17 Claims, 7 Drawing Sheets

CURRENT PERPENDICULAR TO PLANE MAGNETORESISTANCE READ HEAD DESIGN USING A CURRENT CONFINEMENT STRUCTURE PROXIMAL TO AN AIR BEARING SURFACE

RELATED APPLICATIONS

This patent application is a continuation of U.S. patent application having the Ser. No. 12/182,701, and filed on Jul. 30, 2008 now U.S. Pat. No. 8,098,463, which is incorporated by reference herein.

BACKGROUND OF THE INVENTION

1. Field of the Invention

The invention is related to magnetic storage devices, and in particular, to a hard disk drive including a current perpendicular to plane (CPP) magnetoresistance (MR) read head design using a current confinement structure proximal to an air bearing surface (ABS).

2. Statement of the Problem

Of the many magnetic storage devices, a hard disk drive is the most extensively used to store data. The hard disk drive includes a hard disk and an assembly of write and read heads. The assembly of write and read heads is supported by a slider that is mounted on a suspension arm. When the hard disk rotates, an actuator swings the suspension arm to place the slider over selected circular data tracks on the hard disk. The suspension arm biases the slider toward the hard disk, and an air flow generated by the rotation of the hard disk causes the slider to fly on a cushion of air at a very low elevation (fly height) over the hard disk. When the slider rides on the air, the actuator moves the suspension arm to position the write and read heads over selected data tracks on the hard disk. The write and read heads write data to and read data from, respectively, data tracks on the hard disk. Processing circuitry connected to the write and read heads then operates according to a computer program to implement writing and reading functions.

During a reading function, the read head passes over magnetic field transitions on the rotating hard disk. When the read head encounters the magnetic transitions, they interact with the read head to modulate the resistance of an MR sensor within the read head. In order to generate a read signal from the read head, a sense current is injected into the MR sensor. The read signal is generated by the sense current and the modulating resistance within the MR sensor generating a modulating voltage. Circuitry within the hard disk drive senses the voltages in the read head to generate read signals from the read head. The resulting read signals are used to decode data encoded by the magnetic transitions of the data track. In order to increase the amount of storage available on the hard disk drive, the magnetic transitions are typically are placed closer together. One problem with placing the magnetic transitions closer together is that the strength of the magnetic fields used to generate the magnetic transitions tends to be smaller in order to prevent unintended interactions between one magnetic transition and another. When the strength of the magnetic fields is reduced, the amount of resistance modulation within the MR sensor generally decreases due to the lower magnetic field strengths. The decrease in the amount of resistance modulation in the MR sensor reduces the amount of read signal available from the read head for a given sense current.

SUMMARY

Embodiments of the invention increase the strength of a read signal generated by a read head by confining the sense current injected into an MR sensor to a region proximal to the ABS of the read head. When the sense current is confined proximal to the ABS, the current density near the ABS is increased. The increase in current density allows the read head to generate a larger read signal from a smaller change in resistance within the MR sensor. The increased read signal allows higher bit densities on the hard disk, which increases the storage available on the hard disk drive.

In one embodiment of the invention, a CPP MR read head includes an MR sensor between a first shield and a second shield. The MR sensor is in contact with the first shield and the second shield proximal to the ABS. The read head further includes insulating material between the MR sensor and the second shield distal to the ABS. The insulating material between the MR sensor and the second shield electrically isolates the MR sensor from the second shield along a portion of the MR sensor distal to the ABS. A sense current injected into the read head through the MR sensor is confined proximal to the ABS, which increases a read signal generated by the read head.

In another embodiment of the invention, a method of fabricating a CPP MR read head is disclosed. According to the method, a first shield is formed. On the first shield, an MR sensor is formed which includes a back edge that is defined distal to a future ABS of the read head. Insulating material is then formed on the MR sensor proximal to the back edge of the MR sensor to cover a portion of the MR sensor and to leave a portion of the MR sensor exposed. A second shield is then formed such that the second shield contacts the MR sensor proximal to the ABS on the exposed portion of the MR sensor.

The invention may include other exemplary embodiments as described below.

DESCRIPTION OF THE DRAWINGS

The same reference number represents the same element or same type of element on all drawings.

DETAILED DESCRIPTION OF THE INVENTION

FIGS. 1-14 and the following description depict specific exemplary embodiments of the invention to teach those skilled in the art how to make and use the invention. For the purpose of teaching inventive principles, some conventional aspects of the invention have been simplified or omitted. Those skilled in the art will appreciate variations from these embodiments that fall within the scope of the invention. Those skilled in the art will appreciate that the features described below can be combined in various ways to form multiple variations of the invention. As a result, the invention is not limited to the specific embodiments described below, but only by the claims and their equivalents.

Figure 1:
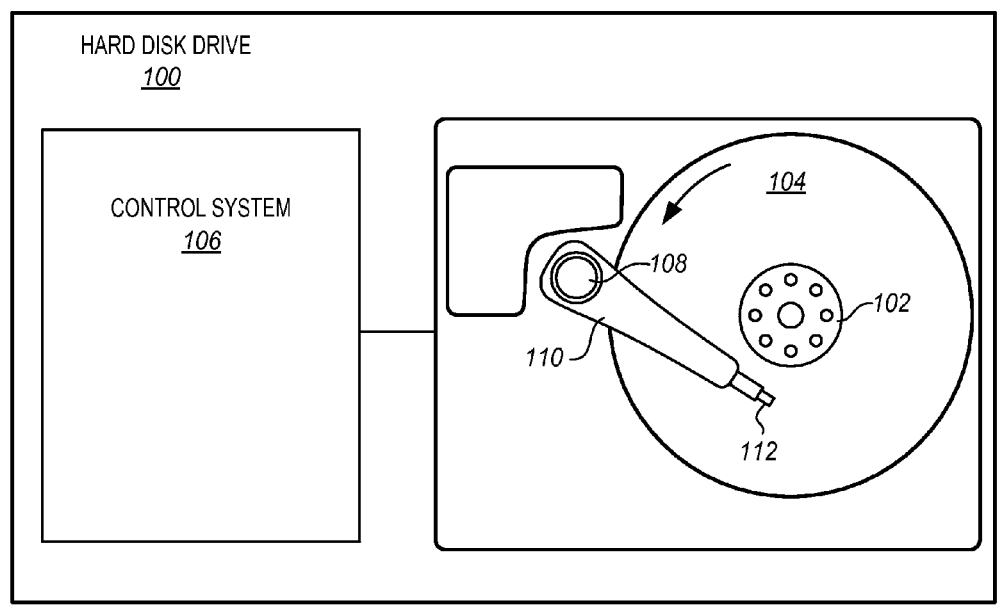
FIG. 1 illustrates a hard disk drive used as a magnetic storage device.

FIG. 1 illustrates a hard disk drive 100 used as a magnetic storage device. Hard disk drive 100 includes a spindle 102, a hard disk 104, a control system 106, an actuator 108, a suspension arm 110, and a slider 112 having an assembly of write and read heads. Spindle 102 supports and rotates hard disk 104 in a direction indicated by the arrow. A spindle motor (not shown) rotates spindle 102 according to control signals from control system 106. Slider 112 is mounted on suspension arm 110, and actuator 108 is configured to rotate suspension arm 110 in order to position the assembly of write and read heads over a desired data track on hard disk 104. Hard disk drive 100 may include other components not shown in FIG. 1, such as a plurality of hard disks, actuators, suspension arms, and sliders.

When hard disk 104 rotates, an air flow generated by the rotation of hard disk 104 causes slider 112 to fly on a cushion of air at a very low elevation (fly height) over rotating hard disk 104. As slider 112 flies on the air, actuator 108 moves suspension arm 110 to position a write head (not shown) and a read head (not shown) over selected data tracks on hard disk 104. The write and read heads write data to and read data from, respectively, data tracks on hard disk 104. Processing circuitry connected to the write and read heads then operates according to a computer program to implement writing and reading functions.

Figure 2:
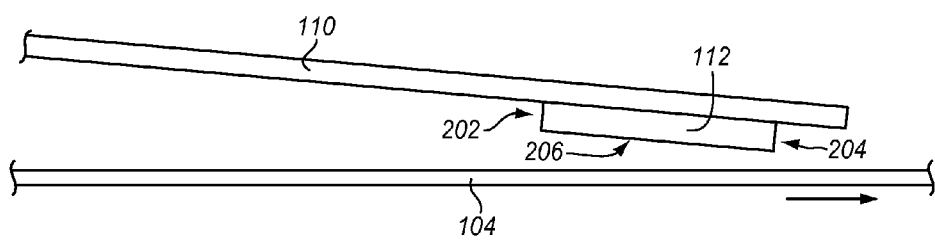
FIG. 2 is a side view illustrating a hard disk drive.

FIG. 2 is a side view illustrating hard disk drive 100. Slider 112 is supported above hard disk 104. Slider 112 includes a front end 202 and an opposing trailing end 204. Slider 112 also includes an air bearing surface (ABS) 206 that faces toward the surface of hard disk 104. A write head (not shown) and a read head (not shown) are formed proximate to trailing end 204, which is further illustrated in FIG. 3.

Figure 3:
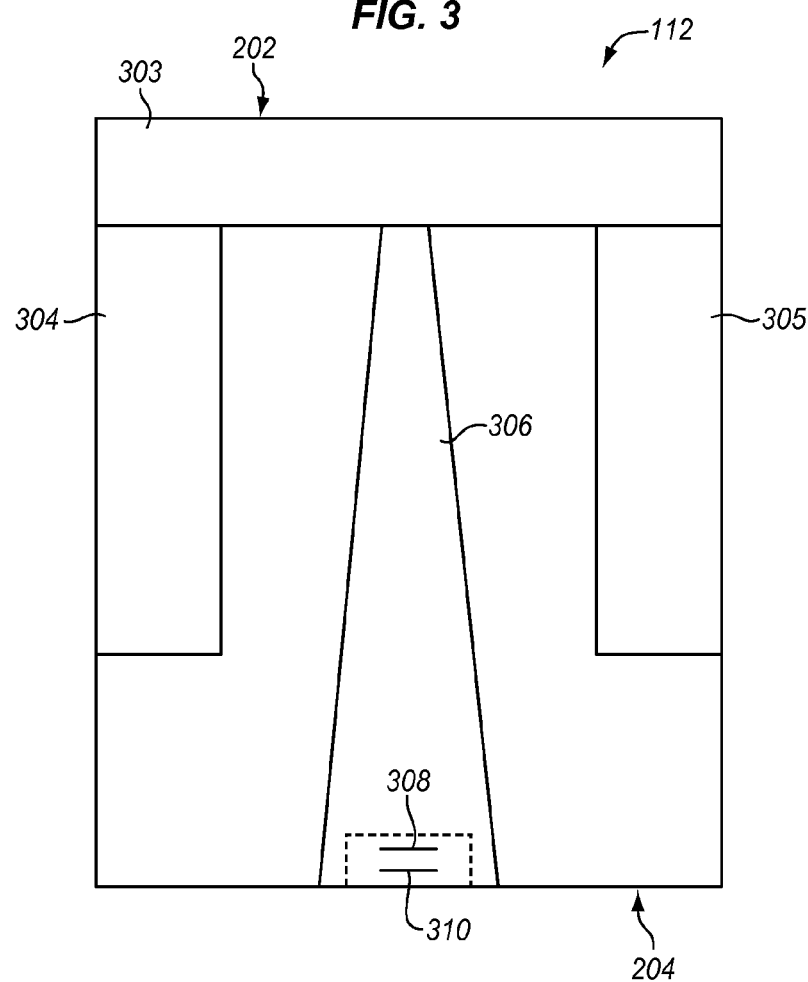
FIG. 3 is an ABS view illustrating a slider.

FIG. 3 is an ABS view illustrating slider 112. ABS 206 of slider 112 is the surface of the page in FIG. 3. Slider 112 has a cross rail 303, two side rails 304-305, and a center rail 306 on ABS 206. The rails, which define how slider 112 flies over the surface of hard disk 104, illustrate just one embodiment, and the configuration of ABS 206 of slider 112 may take on any desired form. Slider 112 includes a write head 310 and a CPP MR read head 308 fabricated proximate to trailing end 204.

Figure 4:
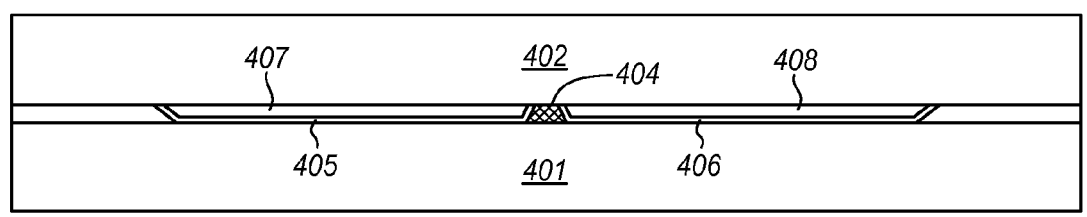
FIG. 4 is an ABS view illustrating a CPP MR read head fabricated in a slider.

FIG. 4 is an ABS view illustrating CPP MR read head 308. CPP MR read head 308 includes a first and second shield 401-402 that sandwich an MR sensor 404 and two side regions at edges of MR sensor 404. In the two side regions, side oxide layers 405-406 separate longitudinal bias layers 407-408, respectively, from first shield 401 and MR sensor 404. MR sensor 404 may comprise a TMR (tunneling MR) sensor, a GMR (giant MR) sensor, or some other type of MR sensor.

Figure 5:
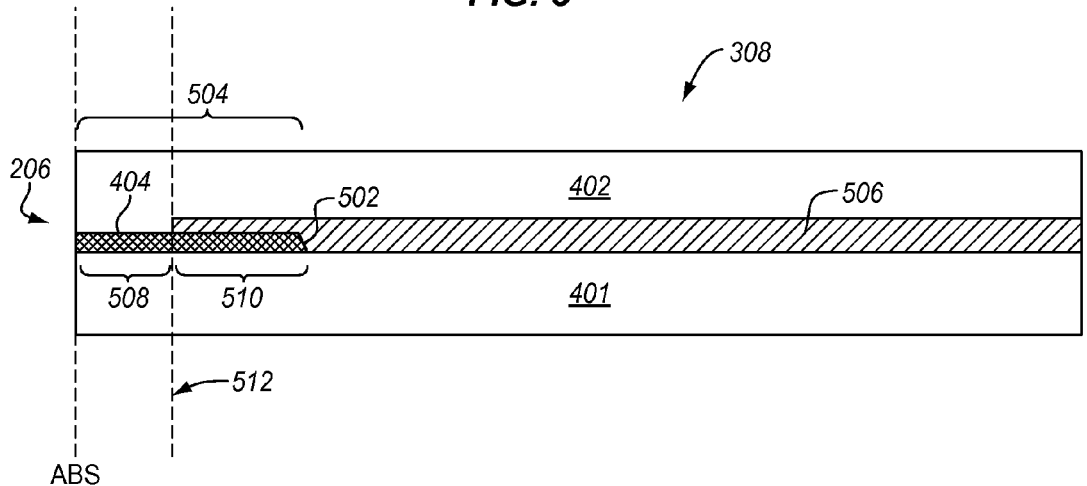
FIG. 5 is a side view illustrating a CPP MR read head fabricated in a slider in an exemplary embodiment of the invention.

FIG. 5 is a side view illustrating CPP MR read head 308 in an exemplary embodiment of the invention. In the view of FIG. 5, CPP MR read head 308 includes an insulating layer 506 between first shield 401 and second shield 402. In addition to separating the first and second shield 401-402, the insulating layer 506 partially separates and electrically isolates second shield 402 from MR sensor 404 between the ABS and a back edge 502 of MR sensor. More particularly, insulating layer 506 is formed between a front insulation edge 512 and a back edge 502 of MR sensor 404. Between front insulation edge 512 and ABS 206, second shield 402 makes contact with MR sensor 404. Due to insulating layer 506 partially isolating MR sensor 404 from second shield 402, a contact region 508 is defined where second shield 402 contacts MR sensor 404. Conversely, an isolation region 510 is defined where second shield 402 does not contact MR sensor 404 between front insulating edge 512 and back edge 502. In some cases contact region 508 may be between about 10 nanometers to 60 nanometers, depending on the desired current density in MR sensor 404. Also, insulating layer 506 on MR sensor 404 within isolation region 510 may have a thickness between about 2 to 10 nanometers.

Figure 6:
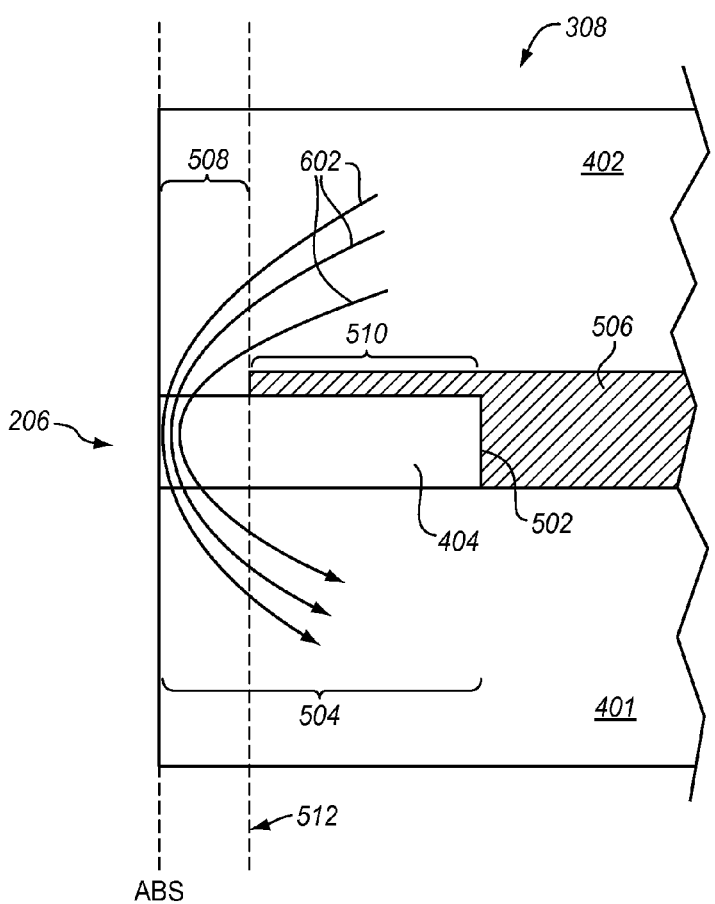
FIG. 6 is a side view illustrating an MR sensor within the CPP MR read head of FIG. 5.

FIG. 6 is a side view illustrating MR sensor 404 within CPP MR read head 308 in an exemplary embodiment of the invention. A sense current 602 flows in CPP MR read head 308 from second shield 402 through MR sensor 404 and into first shield 401 through contact region 508. Because insulating layer 506 electrically isolates second shield 402 from MR sensor 404 along isolation region 510, sense current 602 is confined within MR sensor 404 proximal to ABS 206 within contact region 508.

When the resistance of MR sensor 404 is modulated due to the magnetic fields present in hard disk 104, the resultant voltage modulation (i.e., the read signal generated) is a function of sense current 602 and a volume of MR sensor 404 that sense current 602 is confined to. Sense current 602 and the volume of MR sensor 404 determine a current density within MR sensor 404. As the current density increases in MR sensor 404, a larger read signal is generated for the same resistance modulation. Resistance modulation of MR sensor 404, however, is not uniform throughout the entire MR sensor 404. Magnetic fields present on hard disk 104 penetrate ABS 206 of CPP MR read head 308 into MR sensor 404. The intensity of the resistance modulation within MR sensor 404 decreases as a function of the distance from ABS 206. Therefore, confining sense current 602 proximal to ABS 206 results in a larger read signal generated from CPP MR read head 308. The increase in the read signal is partially a function of the increased current density in MR sensor 404 and the current confinement of sense current 602 proximal to ABS 206.

While it may appear advantageous to reduce the distance between ABS 206 and back edge 502 (also called a stripe height 504 of MR sensor 404), it may not be feasible to do so. The stability of MR sensor 404 is reduced as stripe height 504 is reduced. The reduction in stability is due to various factors, including spin-transfer torques from spin-polarized electrons travelling through the free and pinned layers of the MR sensor, which can cause magnetization reversal of these layers.

Figure 7:
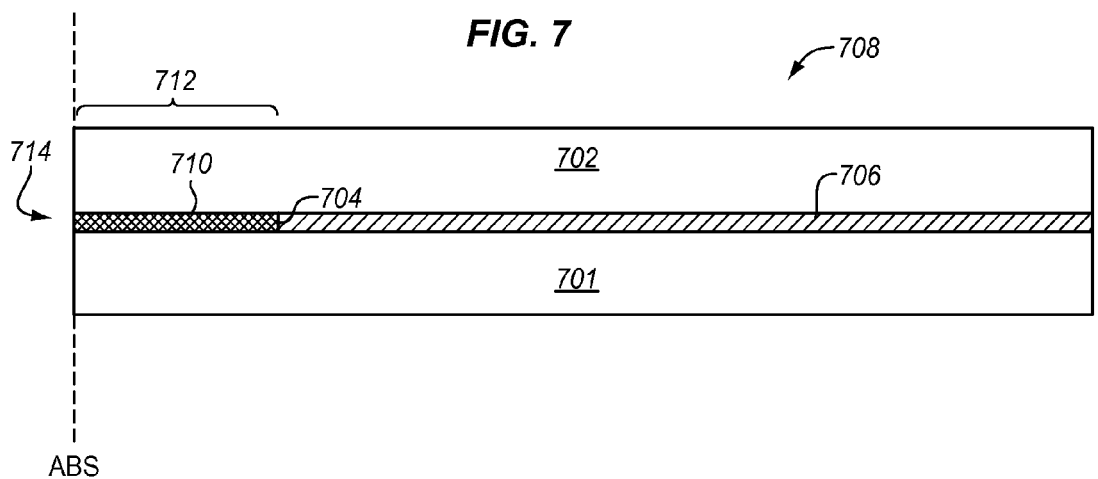
FIG. 7 is a side view illustrating a CPP MR read head fabricated in a slider.

As a comparison to FIG. 5, FIG. 7 is a side view illustrating a typical CPP MR read head 708 which does not include current confinement near an ABS 714. CPP MR read head 708 includes an insulating layer 706 which insulates the conductive first shield 701 from the conductive second shield 702. An electrical connection is formed between first shield 701 and second shield 702 through MR sensor 710 between ABS 714 and a back edge of the MR sensor 710 (also known as a stripe height 712 of MR sensor 710). Because the first and second shield 701-702 contacts MR sensor 710 along the entire stripe height 712 of MR sensor 710, injecting a sense current from second shield 702 through MR sensor 710 into first shield 701 is not confined to a portion of MR sensor 710 proximal to ABS 714. More particularly, the sense current injected into MR sensor 710 can travel between any portion of MR sensor 710 along stripe height 712 which contacts the first and second shield 701-702.

Figure 8:
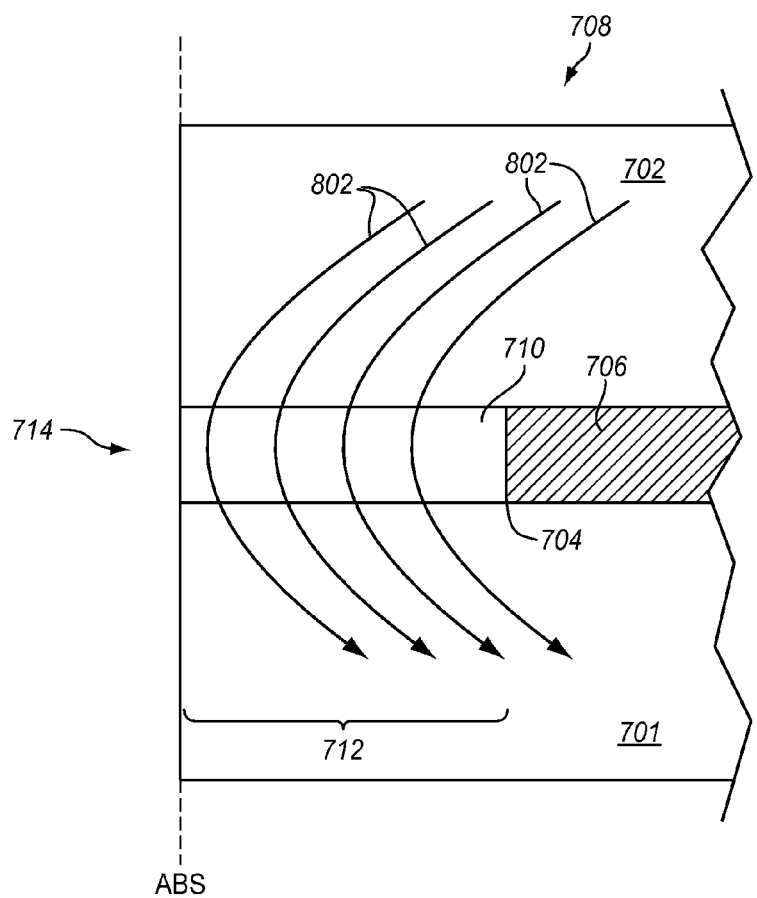
FIG. 8 is a side view illustrating the MR sensor in the CPP MR read head of FIG. 7.

FIG. 8 is a side view illustrating MR sensor 710 within CPP MR read head 708. A sense current 802 indicates the flow of current between second shield 702 and first shield 701 through MR sensor 710 along a stripe height 712 of CPP MR sensor 710. Because first shield 701 and second shield 702 contacts MR sensor 710 along the entire stripe height 712, an area which conducts sense current 802 within MR sensor 710 is larger as compared to an area which conducts sense current 602 within MR sensor 404 in contact region 508 of FIG. 6. Because the area which conducts sense current 802 is larger in FIG. 8 as compared to FIG. 6, a current density proximal to ABS 714 within MR sensor 708 in FIG. 8 is lower as compared to the current density proximal to ABS 206 within MR sensor 404 in FIG. 6. The lower current density in FIG. 8 results in a smaller read signal being generated for CPP MR read head 708 of FIG. 8 as compared to CPP MR read head 308 of FIG. 6.

Figure 9:
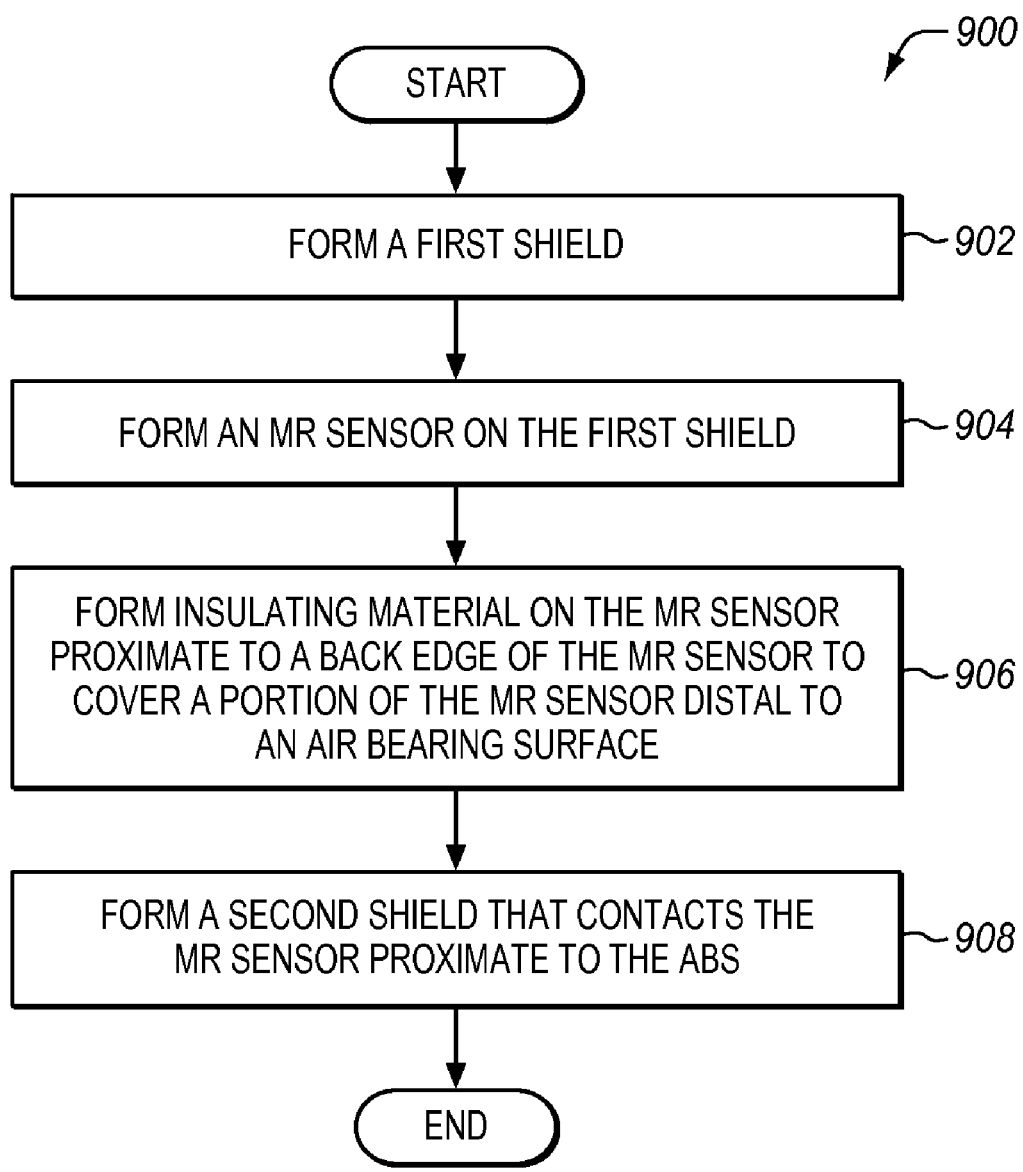
FIG. 9 is a flowchart illustrating an exemplary method of fabricating the CPP MR read head of FIG. 5.
Figure 10:
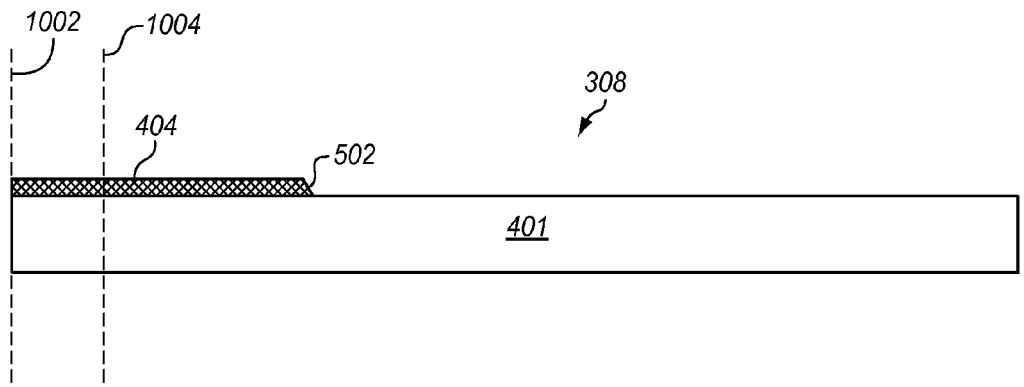
FIG. 10 is a side view illustrating the CPP MR read head of FIG. 5 as fabricated by a step of the method of FIG. 9.

FIG. 9 is a flowchart illustrating an exemplary method 900 of fabricating CPP MR read head 308 of FIG. 5 and FIG. 6. Method 900 may also include fabricating other CPP MR read heads not show. The steps of FIG. 9 are not all inclusive and may include other steps not shown. Step 902 includes forming a first shield. Step 904 includes forming an MR sensor on the first shield. FIG. 10 illustrates the result of performing steps 902 and 904 of method 900. MR sensor 404 formed on first shield 401 includes a back edge 502 and a lapping surface 1002. A future ABS 1004 is indicated by a dashed line to show an approximate location where future ABS 1004 will be after performing a lapping process to remove material between lapping surface 1002 and future ABS 1004.

Figure 11:
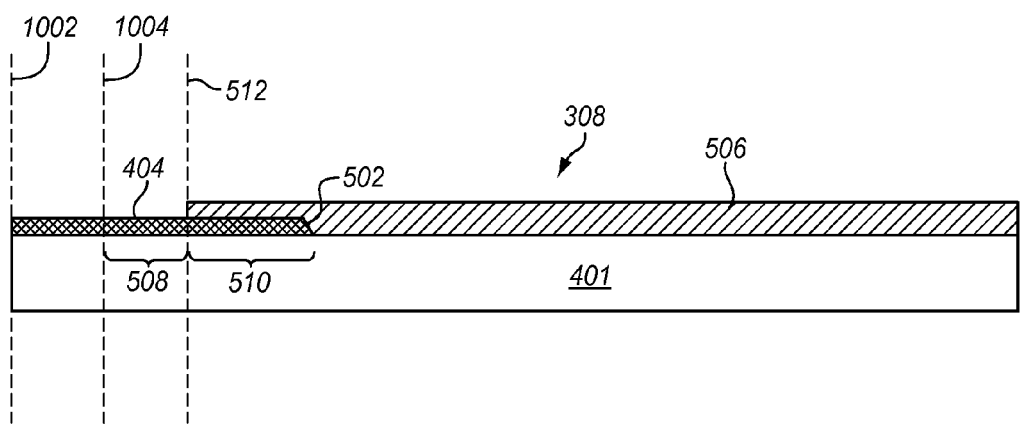
FIG. 11 is a side view illustrating the CPP MR read head of FIG. 5 after depositing insulating material according to a step of the method of FIG. 9.

Step 906 of method 900 includes forming insulating material on MR sensor 404 and on first shield 401. FIG. 11 illustrates the result of performing step 906 of method 900. Insulating layer 506 is formed on first shield 401, and on a portion of MR sensor 404 proximate to back edge 502 which covers a back portion of MR sensor 404 proximate to back edge 502 and away from future ABS 1004. When insulating layer 506 covers a back portion of MR sensor 404, a front portion proximal to the future ABS of CPP MR read head 308 is left exposed. The back portion of the MR sensor 404 which is covered by insulating layer 506 defines an isolation region 510 near back edge 502 and a contact region 508 near future ABS 1004 of MR sensor 404. Insulating layer 506 may overlap MR sensor 404 in such a way that contact region 508 is defined to be between about 10 nanometers and 60 nanometers in length.

Figure 12:
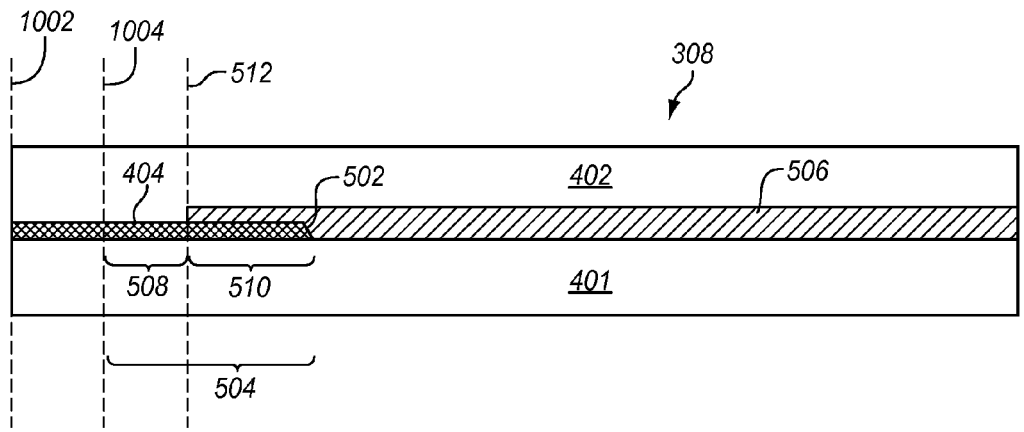
FIG. 12 is a side view illustrating the CPP MR read head of FIG. 5 after forming a second shield according to a step of the method of FIG. 9.

Step 908 of method 900 includes forming a second shield that contacts the MR sensor 404 proximate to future ABS 1004. FIG. 12 is the result of performing step 908 of method 900. After forming second shield 402, second shield 402 contacts the front portion of MR sensor 404 proximal to future ABS 1004. Because insulating layer 506 partially covers a portion of MR sensor 404 near back edge 502, electrical contact between second shield 402 and MR sensor 404 is confined proximate to future ABS 1004 of CPP MR read head 308. After a lapping process to remove material from lapping surface 1002, CPP MR read head 308 of FIG. 5 and FIG. 6 is the result.

Figure 13:
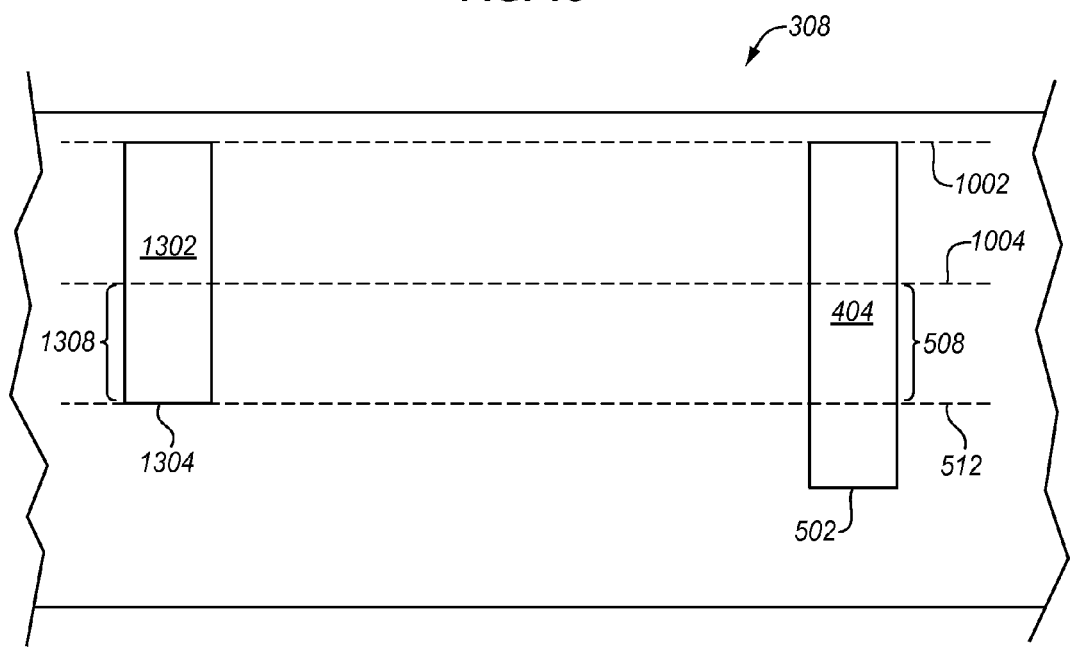
FIG. 13 is a side view illustrating a portion of a row of the wafer of FIG. 13 in an exemplary embodiment of the invention.

FIG. 13 is a top view illustrating CPP MR read head 308 (See FIG. 12) which may optionally include an electronic lapping guide 1302 in an exemplary embodiment of the invention. Electronic lapping guide 1302 is typically fabricated in or alongside CPP MR read head 308. In the embodiment shown in FIG. 13 electronic lapping guide 1308 is shown as being within CPP MR read head 308. When read heads are fabricated on a wafer, many read heads are fabricated alongside each other in order to utilize as much of the wafer area as possible. During processing, the wafer is cut into rows of read heads. When in row form, the read heads are processed further (i.e., lapping the row, etc.) until the rows are cut into a plurality of individual read heads. When electronic lapping guide 1302 is fabricated along with MR sensor 404, different features on MR sensor 404 are coplanar (i.e., aligned in the same plane) with electronic lapping guide 1302. Because the different features are coplanar, measurements made on electronic lapping guide 1302 are representative of features on CPP MR sensor 404. For example, in FIG. 13 contact region 508 on CPP MR sensor 404 is similar to a first region 1308 on electronic lapping guide 1302. Contact region 508 on CPP MR read head 308 is defined by front insulating edge 512 and future ABS 1004. Correspondingly, first region 1308 on electronic lapping guide 1302 is defined by features coplanar with future ABS 1004 and front insulating edge 512.

Figure 14:
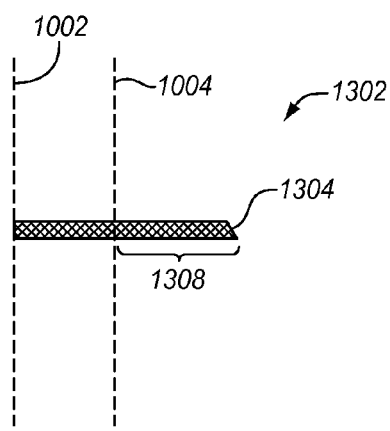
FIG. 14 is a side view illustrating an electronic lapping guide in an exemplary embodiment of the invention.

FIG. 14 is a side view of lapping guide 1302 in an exemplary embodiment of the invention. When material is removed during a lapping process from lapping surface 1002, a resistance measurement of electronic lapping guide 1302 is a function of region 1308, which corresponds approximately to contact region 508 of FIG. 12. Therefore, as lapping surface 1002 approaches future ABS 1004 as material is removed, the measurement of electronic lapping guide 1302 and first region 1308 will approximate contact region 508 on MR sensor 404 (see FIG. 5). This allows a fabrication operator to determine approximately the size of contact region 508 on MR sensor 404 by measuring electronic lapping guide 1302.

Although specific embodiments were described herein, the scope of the invention is not limited to those specific embodiments. The scope of the invention is defined by the following claims and any equivalents thereof.

We claim:

1. An apparatus comprising:
    a current perpendicular to plane (CPP) magnetoresistance (MR) head including a current confinement structure formed on an MR sensor that concentrates a sense current in the MR sensor proximate to an air bearing surface (ABS).

2. The apparatus of claim 1 wherein:
    the current confinement structure comprises:
        insulating material formed on the MR sensor distal to the ABS and not on the MR sensor proximate to the ABS.

3. The apparatus of claim 2 wherein:
    the MR sensor contacts a shield along a length of between about 10 nanometers to 60 nanometers proximate to the ABS.

4. The apparatus of claim 2 wherein:
    the insulating material formed on the MR sensor distal to the ABS has a thickness of about 2 to 10 nanometers.

5. The apparatus of claim 2 wherein:
    the CPP MR head of claim 1 further includes an electronic lapping guide having a back edge coplanar with a front edge of the insulating material.

6. The apparatus of claim 1 wherein:
    the MR sensor comprises at least one of a giant MR sensor and a tunneling MR sensor.

7. An apparatus comprising:
a current perpendicular to plane (CPP) head having a magnetoresistance (MR) sensor; and
a current confinement structure formed on the MR sensor and away from an air bearing surface (ABS) to concentrate a sense current so that a current density in the MR sensor proximate to the ABS is higher than a current density in the MR sensor distal to the ABS.

8. The apparatus of claim 7 wherein:
the current confinement structure comprises insulating material located away from the ABS and sandwiched between a shield and the MR sensor to concentrate a sense current in the MR sensor proximate to the ABS.

9. The apparatus of claim 8 wherein:
the insulating material has a thickness of about 2 to 10 nanometers.

10. The apparatus of claim 8 further comprising:
an electronic lapping guide having a back edge coplanar with a front edge of the insulating material.

11. The apparatus of claim 7 wherein:
the MR sensor comprises at least one of a giant MR sensor and a tunneling MR sensor.

12. The apparatus of claim 7 wherein:
the MR sensor contacts a shield along a length of between about 10 nanometers to 60 nanometers proximate to the ABS.

13. A head comprising:
a first shield;
a second shield;
a magnetoresistance (MR) sensor formed on the first shield; and
insulating material located away from an air bearing surface (ABS) and sandwiched between the MR sensor and the second shield, wherein the insulating material electrically isolates the MR sensor from the second shield distally from the ABS to concentrate a sense current in the MR sensor proximate to the ABS.

14. The head of claim 13 wherein:
the MR sensor contacts the second shield along a length of between about 10 nanometers to 60 nanometers proximate to the ABS.

15. The head of claim 13 wherein:
the insulating material has a thickness of about 2 to 10 nanometers.

16. The head of claim 13 further comprising:
an electronic lapping guide having a back edge coplanar with a front edge of the insulating material.

17. The head of claim 13 wherein:
the MR sensor comprises at least one of a giant MR sensor and a tunneling MR sensor.

* * * * *

UNITED STATES PATENT AND TRADEMARK OFFICE
CERTIFICATE OF CORRECTION

PATENT NO. : 8,284,525 B2
APPLICATION NO. : 13/314449
DATED : October 9, 2012
INVENTOR(S) : Gill et al.

It is certified that error appears in the above-identified patent and that said Letters Patent is hereby corrected as shown below:

Title Page, Item (75) Inventors, please change inventor's name from "Werner J. Douglas" to --Douglas J Werner--

Signed and Sealed this
First Day of January, 2013

David J. Kappos
*Director of the United States Patent and Trademark Office*